US007945881B2

(12) United States Patent
Chun et al.

(10) Patent No.: US 7,945,881 B2
(45) Date of Patent: May 17, 2011

(54) METHOD OF REDUCING CROSSTALK INDUCED NOISE IN CIRCUITRY DESIGNS

(75) Inventors: Sungjun Chun, Austin, TX (US);
Anand Haridass, Austin, TX (US);
Jesus Montanez, Austin, TX (US);
Xiaomin Shen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 11/961,440

(22) Filed: Dec. 20, 2007

(65) Prior Publication Data
US 2009/0164962 A1    Jun. 25, 2009

(51) Int. Cl.
*G06F 17/50* (2006.01)
(52) U.S. Cl. ......... 716/106; 716/115; 716/136; 716/137
(58) Field of Classification Search .......... 716/106–108, 716/110–115, 126, 136–137
See application file for complete search history.

(56) References Cited

U.S. PATENT DOCUMENTS

| 5,043,807 | A | 8/1991 | Rabii |
| 6,378,109 | B1 * | 4/2002 | Young et al. .................. 716/4 |
| 6,499,134 | B1 | 12/2002 | Buffet et al. |
| 6,785,627 | B2 | 8/2004 | Corr |
| 7,203,249 | B2 | 4/2007 | Raleigh et al. |
| 2002/0078425 | A1 | 6/2002 | Mehrotra et al. |
| 2003/0115557 | A1 | 6/2003 | Elzinga |
| 2004/0103386 | A1 | 5/2004 | Becer et al. |
| 2004/0117752 | A1 | 6/2004 | Kim et al. |
| 2005/0204323 | A1 | 9/2005 | Chen |
| 2007/0157145 | A1 | 7/2007 | Hung |

FOREIGN PATENT DOCUMENTS

| JP | 11069895 A | 3/1999 |
| WO | 2004013988 A1 | 2/2004 |

* cited by examiner

*Primary Examiner* — Paul Dinh
(74) *Attorney, Agent, or Firm* — Dillion & Yudell LLP

(57) ABSTRACT

A method of reducing crosstalk induced noise in a physical circuit wiring design constructs a spatial vector for each interconnect wire segment in the physical circuit wiring design. The method compares the spatial vectors of said physical circuit wiring design and identifies any of the spatial vectors that are parallel to each other and have opposite directions. The method may identify all drivers and receivers in the physical circuit wiring design, and trace each interconnect line, starting with its driver, to determine a routed length from the driver to each segment break point of the interconnect line. The method may construct the spatial vector by defining an origin in the physical circuit wiring design. The method determines a starting point and an ending point of the spatial vector with respect to the origin. The starting point of the spatial vector is the break point of the interconnect wire segment closer to the driver. The ending point of the spatial vector is the break point of the interconnect wire segment farther from the driver. The method may define a Cartesian coordinate system with respect to the origin. The Cartesian coordinate system may be orthogonal with the interconnect wire segments of the physical circuit wiring design. The method may define one or more geometry windows in the physical circuit wiring design and compare the spatial vectors in each geometry window.

18 Claims, 3 Drawing Sheets

US 7,945,881 B2

METHOD OF REDUCING CROSSTALK INDUCED NOISE IN CIRCUITRY DESIGNS

BACKGROUND OF THE INVENTION

1. Technical Field

The present invention relates in general to the field of designing physical circuit wiring, and more particularly to a method of reducing crosstalk induced noise in physical circuit wiring designs, such as multi-gigahertz designs, using spatial vector analysis.

2. Description of the Related Art

One problem in the design of physical circuit wiring is crosstalk induced noise. When interconnects are positioned close together and parallel to each other, the interconnects couple to each other through mutual capacitance and mutual inductance. When a signal propagates down a so-called aggressor interconnect, part of the energy of the signal is coupled to adjacent parallel victim interconnects. The coupled energy may be seen as crosstalk induced noise on the receiver connected to the victim interconnect when the signal directions on the aggressor and victim interconnects are opposite to each other. Crosstalk induced noise is a particular problem with multi-gigahertz designs.

Crosstalk induced noise may be reduced by a technique called non-interleaved routing, in which signals traveling in the same direction are routed adjacent each other in one spatial channel while signals traveling in the opposite direction are routed adjacent each other in a spatially separate channel. In modern board and module designs with large numbers of densely routed interconnects travelling in circuitous routes, it is not a trivial matter to isolate and separate signals traveling in opposite directions.

SUMMARY OF THE INVENTION

The present invention provides methods of reducing crosstalk induced noise in a physical circuit wiring design. Embodiments of the method according to the present invention construct a spatial vector for each connect wire segment in the physical circuit wiring design. The method compares the spatial vectors of said physical circuit wiring design and identifies any of the spatial vectors that are parallel to each other and have opposite directions.

In some embodiments, the method identifies all drivers and receivers in the physical circuit wiring design. The method traces each interconnect line in the physical circuit wiring design, starting with the driver associated with the interconnect line, to determine a routed length from the driver to each segment break point of the interconnect line. The method stores the routed length from the driver to each segment break point.

The method may construct the spatial vector by defining an origin in the physical circuit wiring design. The method determines a starting point and an ending point of the spatial vector with respect to the origin. The starting point of the spatial vector is the break point of the interconnect wire segment closer to the driver. The ending point of the spatial vector is the break point of the interconnect wire segment farther from the driver. The method may define a Cartesian coordinate system with respect to the origin. The Cartesian coordinate system may be orthogonal with the interconnect wire segments of the physical circuit wiring design.

In some embodiments, the method defines a geometry window in the physical circuit wiring design. The method compares the spatial vectors in the geometry window. The method may define multiple geometry windows and compare the spatial vectors in each geometry window. Examples of geometry windows include transmit channels and receive channels.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 1:
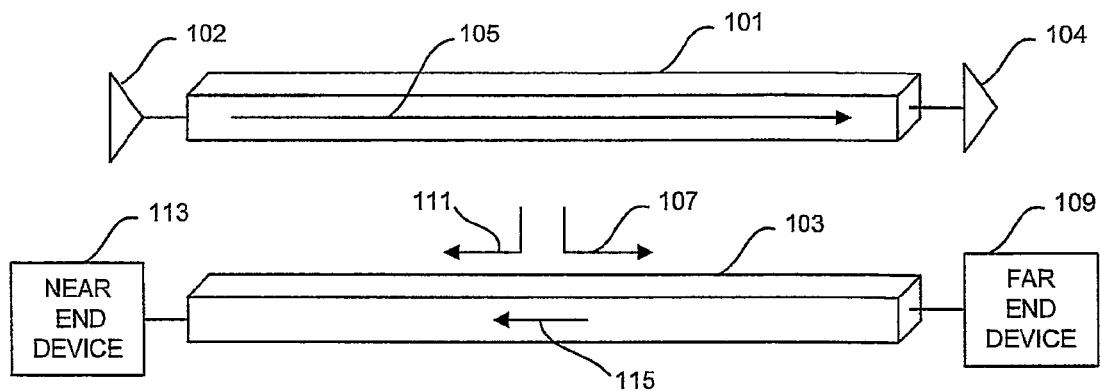
FIG. 1 is a diagram illustrating the mechanism of crosstalk induced noise.

Referring now to drawings, and first to FIG. 1, an aggressor interconnect wire segment 101 is positioned near and parallel to a victim interconnect wire segment 103. Interconnect wire segments 101 and 103 are coupled to each other through mutual inductance and mutual capacitance. When a signal 105 propagates down aggressor interconnect segment 101 from a transmitter 102 to a receiver 104, part of the energy on aggressor interconnect segment 101 is coupled onto victim interconnect segment 103 through mutual capacitance and mutual inductance. Mutual capacitance generates currents that flow in both directions on victim segment 103. Thus a mutual capacitance induced current 107 flows on victim interconnect segment 103 toward a far end device 109, and a mutual capacitance induced current 111 flows toward a near end device 113. Mutual inductance generates a current 115 that flows on victim interconnect segment 103 only toward near end device 113. Far end device 109 may be either a transmitter or a receiver and near end device 113 may be either a receiver or a transmitter.

The mutual capacitance induced current 107 that flows toward far end device 109 causes noise, which is referred to as far end crosstalk (FEXT). The mutual capacitance induced current 111 and the mutual inductance induced current 115 that flow toward near end device 113 causes noise, which is referred to as near end crosstalk (NEXT). The width of FEXT noise is proportional to the edge rate of the aggressor signal. Therefore FEXT is usually a short pulse for multi-gigahertz designs. The width of NEXT noise is two times the electrical length of the wire interconnect. NEXT becomes more prominent when multiple aggressor signals are wired close together, and noise from aggressors accumulates on the victim.

The severity of problems caused by NEXT induced noise depends on whether near end device 113 is a transmitter or a receiver. When near end device 113 is a transmitter, NEXT induced noise, indicated by currents 111 and 115, on victim interconnect wire segment 103 propagates into the driver of a signal, were signal integrity is not concern. However, when near end device 113 is a receiver, NEXT induced noise on victim interconnect wire segment 103 propagates into the receiver of a signal, thus degrading the quality of signals received at near end device 113.

NEXT may be reduced by a technique known as non-interleaved routing, in which signals traveling in the same direction are routed nearby each other while signals traveling in opposite directions are kept apart from each other. Non-interleaved routing seeks to reduce NEXT induced noise by routing all transmit signals together in one channel and all receive signals together in a separate channel. However, in large designs, interconnects are often wired in loops due to various space constraints. Often, interconnect wire segments start off routed in the same direction, but become routed in the opposite direction after a few turns and vias.

Figure 2:
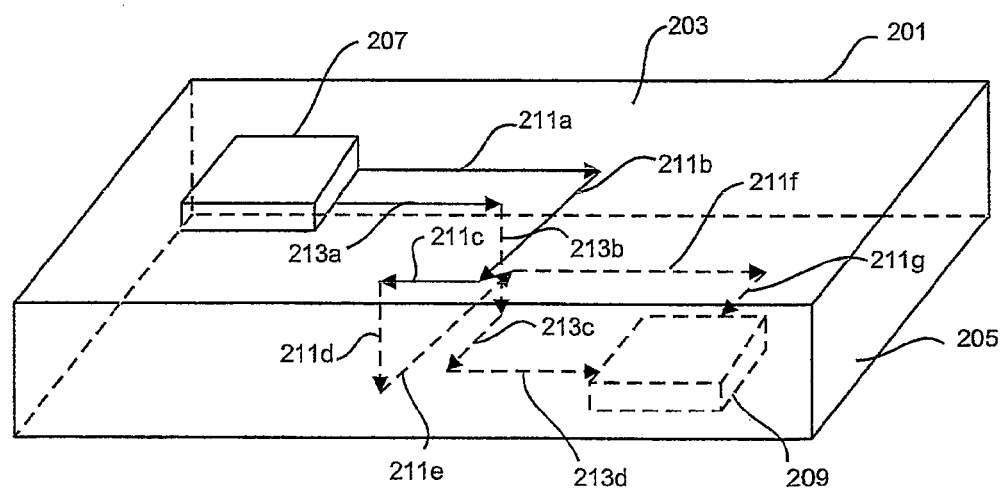
FIG. 2 is an isometric view of a portion of a printed circuit board.

FIG. 2 illustrates a portion 201 of a simplified printed circuit board. Portion 201 includes a top surface 203 and a bottom surface 205. FIG. 2 illustrates a possible routing of two separate transmit signals from a device 207 fixed to top surface to 203 to device 209 affixed to bottom surface 205. One transmit signal is routed in an interconnect 211, which comprises interconnect wire segments 211*a*-211*g*. The other transmit signals routed in an interconnect 213, which comprises segments 213*a*-213*d*. Signals leave device 207 on segments 211*a* and 213*a* traveling parallel to each other and in the same direction; however, the signals travel on segments 211*e* and 213*c* parallel to each other but in opposite directions. Thus NEXT induced on segment 213*c* by segment 211 e will propagate to the receiving device 209, and hence degrade the quality of signal received by 209. Likewise, NEXT induced on segment 211*e* by segment 213*c* will also propagate to the receiving device 209, and hence degrade the quality of signal received by 209.

Figure 3:
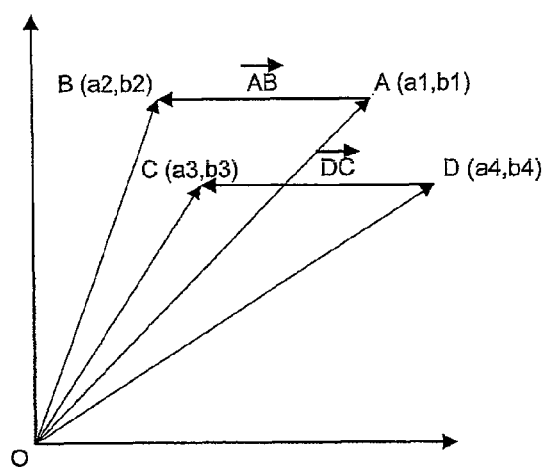
FIG. 3 is a vector diagram illustrating parallel vectors directed in the same direction.
Figure 4:
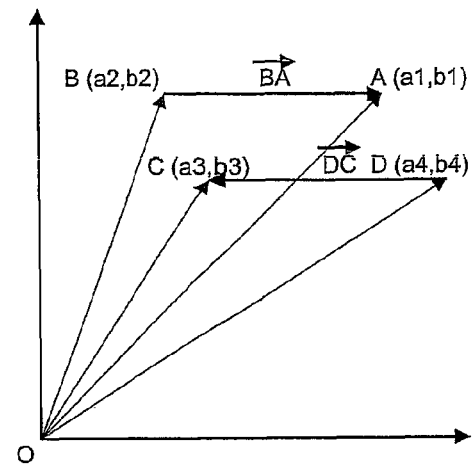
FIG. 4 is a vector diagram illustrating parallel vectors directed in opposite directions; and, FIG. 5 is a flow chart of an embodiment processing according to the present invention.

FIGS. 3 and 4 are vector diagrams illustrating principles of the present invention. In FIG. 3, a vector $\vec{AB}$ represents current flowing in an interconnect wire segment from a point A to a point B. A vector $\vec{DC}$ represents current flowing in an interconnect wire segment from a point D to a point C. In some embodiments of the present invention, a point on a circuit board is designated as the origin O. Origin O may conveniently be placed at the lower left-hand corner of the printed circuit board. A Cartesian coordinate system represented by x and y axes may be defined with reference to origin O. The axes may be defined so as to be orthogonal with the directions of the interconnect wire segments on the printed circuit board so as to simplify calculations according to the present invention. Every point on the printed circuit board may be identified by an x, y coordinate. While FIGS. 3 and 4 illustrate a two-dimensional embodiment, it will be apparent to those skilled in the art that the invention may be applied in three dimensions in which points of a physical circuit wiring design are defined by x, y, and z coordinates.

Vector $\vec{AB}$ is the difference of vectors $\vec{OB}$ and $\vec{OA}$, as indicated in the following vector equation:

$$\vec{AB} = \vec{OB} - \vec{OA} = (a2\hat{x}+b2\hat{y})-(a1\hat{x}+b1\hat{y})=(a2-a1)\hat{x}+(b2-b1)\hat{y}$$

where $\hat{x}$ and $\hat{y}$ are unit vectors. Vector $\vec{DC}$ is the difference of vectors $\vec{OC}$ and $\vec{OD}$, as indicated by the following vector equation:

$$\vec{DC} = \vec{OC} - \vec{OD} = (a3\hat{x}+b3\hat{y})-(a4\hat{x}+b4\hat{y})=(a3-a4)\hat{x}+(b3-b4)\hat{y}.$$

With the orientation of the Cartesian coordinate system of FIG. 3, y coordinates b1 and b2 are equal to each other. Similarly, y coordinates b3 and b4 are equal to each other. Accordingly, vectors $\vec{AB}$ and $\vec{DC}$ are parallel to each other. Additionally, as shown in the following equations:

$$\vec{AB} = -|a2-a1|\hat{x}$$

$$\vec{DC} = -|a3-a4|\hat{x}$$

vectors $\vec{AB}$ and $\vec{DC}$ have the same sign. Accordingly, they are directed in the same direction. It should be recognized the result is not dependent upon the choice of coordinate systems.

Vectors $\vec{AB}$ and $\vec{DC}$ are parallel to each other and directed in the same direction regardless of the coordinate system. In general, vectors may be determined to be parallel to each other by calculating their vector or "cross" product. Two vectors are parallel if their cross product is equal to zero.

In FIG. 4, vector $\vec{BA}$ is the difference between vector $\vec{OA}$ and vector $\vec{OB}$, as indicated in the following vector equation:

$$\vec{BA} = \vec{OA} - \vec{OB} = (a1\hat{x}+b1\hat{y})-(a2\hat{x}+b2\hat{y})=(a1-a2)\hat{x}+(b1-b2)\hat{y}$$

Again, vector $\vec{DC}$ is the difference of vectors $\vec{OC}$ and $\vec{OD}$, as indicated bellow:

$$\vec{DC} = \vec{OC} - \vec{OD} = (a3\hat{x}+b3\hat{y})-(a4\hat{x}+b4\hat{y})=(a3-a4)\hat{x}+(b3-b4)\hat{y}$$

In FIG. 4, b1=b2 and b3=b4. Therefore, $\vec{BA}=|a2-a1|\hat{x}$, and $\vec{DC}=-|a3-a4|\hat{x}$. As shown by their opposite signs, $\vec{BA}$ and $\vec{DC}$ are directed in opposite directions.

Figure 5:
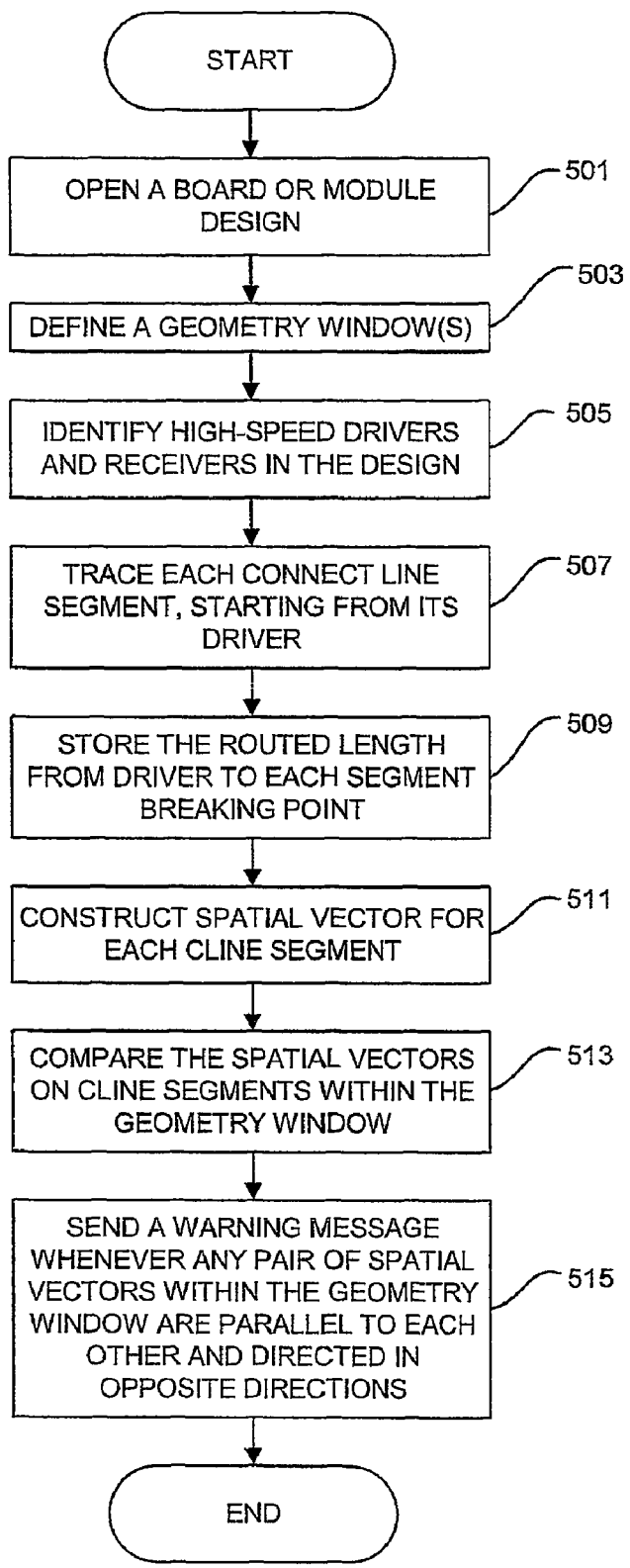

FIG. 5 is a flow chart of an embodiment of processing according to the present invention. Methods according to the present invention may be implemented in a suitably programmed computer system. The system opens a board or module design, as indicated at block 501. A board or module design is stored in a database as a list of the detailed properties that define exactly how the physical circuit wiring is wired. Properties pertinent to the present invention include x,y coordinates, which would specify the locations of points in a particular layer; pin type, which may be IN, OUT, or BI (directional); and, dine segment length, which specifies the length of each interconnect wire segment.

After opening the board or module design, at block 501, one or more geometry windows are defined, as indicated at block 503. A geometry window is a bounded area or space of interest according to the present invention. A geometry window is an area of interest to which methods according to the present invention are applied. For example, a geometry window may comprise a transmit channel or a receive channel in the design.

Next, as indicated at block 505, the method identifies the high-speed drivers and receivers in the design, which information is provided by the pin type. If pin type is OUT, the pin is connected to a driver. If pin type is IN, the pin is connected to a receiver. If pin type is BI, and signals flow in both directions. Some embodiments of the present invention are not concerned with reducing crosstalk induced on bidirectional receivers. After identifying all high-speed drivers, the system traces each interconnect wire segment, starting from its driver, as indicated at block 507. Tracing comprises calculating the routed length of the interconnect from the driver to each segment breaking point. The routed length from the driver to the beginning point of the ith segment is given by the following equation:

$$length_{drv \to a} = \sum_{j=1}^{i-1} length_j$$

The routed length to the ending point of the ith segment is:

$$length_{drv \to b} = length_{drv \to a} + length_i$$

Then, as indicated at block 509, the system stores the routed length from driver to each segment breaking point for each interconnect line.

After having stored the routed lengths, at block 509, the system constructs a spatial vector for each interconnect wire segment, as indicated at block 511. Special vectors are constructed and analyzed in the manner described with reference to FIGS. 3 and 4. The starting and ending points of each segment are identified by coordinates in the board or module design. If $length_{drv \to a} > length_{drv \to b}$, then the segment can be denoted as spatial vector $\overrightarrow{BA}$. If $length_{drv \to a} < length_{drv \to b}$, then the segment can be denoted as spatial vector $\overrightarrow{AB}$. Then, as indicated at block 513, the system compares the spatial vectors on the interconnect wire segments within the geometry window. The comparison may be performed pairwise between adjacent segments. The system is looking for spatial vectors that are parallel to each other but are directed in opposite directions. As indicated at block 515, the system sends a warning message whenever any pair of spatial vectors within the geometry window that are parallel to each other and directed in opposite directions. A board designer may then reroute one or more segments.

From the foregoing, it will be apparent to those skilled in the art that systems and methods according to the present invention are well adapted to overcome the shortcomings of the prior art. While the present invention has been described with reference to presently preferred embodiments, those skilled in the art, given the benefit of the foregoing description, will recognize alternative embodiments. Accordingly, the foregoing description is intended for purposes of illustration and not of limitation.

What is claimed is:

1. In a computer system, a method of reducing crosstalk induced noise in a physical circuit wiring design, the method comprising:
    generating, by a processor execution of code on the computer system, spatial vectors for interconnect wire segments in the physical circuit wiring design, said spatial vectors representing orientations of said interconnect wire segments and being directed in the direction of current flow in said interconnect wire segments;
    comparing spatial vectors of said physical circuit wiring design;
    identifying any of said spatial vectors that are parallel to each other and have opposite directions; and
    providing a warning message whenever a first spatial vector is parallel to and directed in an opposite direction to a second spatial vector, wherein said warning message provides an indication for a board designer to reroute one or more segments.

2. The method as claimed in claim 1, further comprising:
    identifying all drivers in said physical circuit wiring design; and
    tracing interconnect lines in said circuit design, starting with the driver associated with said interconnect line, to determine a routed length from said driver to each interconnect wire segment break point.

3. The method as claimed in claim 2, further comprising: storing said routed length.

4. The method as claimed in claim 2, wherein said constructing said spatial vector comprises:
    defining an origin in said circuit design;
    determining a starting point of said spatial vector with respect to said origin; and
    determining an ending point of said spatial vector with respect to said origin.

5. The method as claimed in claim 4, further comprising:
    defining a Cartesian coordinate system with respect to said origin.

6. The method as claimed in claim 5, wherein said Cartesian coordinate system is orthogonal to said connector wire segments.

7. The method as claimed in claim 4, wherein:
    said starting point of said spatial vector is a break point of said interconnect wire segment closer to said driver; and
    said ending point of said spatial vector is the break point of said interconnect wire segment farther from said driver.

8. The method as claimed in claim 1 further comprising:
    defining a geometry window in said physical circuit wiring design; and
    wherein comparing said spatial vectors comprises comparing said spatial vectors in said geometry window.

9. The method as claimed in claim 8, wherein said geometry window comprises a transmit channel in said physical circuit wiring design.

10. The method as claimed in claim 8, wherein said geometry window comprises a receive channel in said physical circuit wiring design.

11. In a computer system, a method of reducing crosstalk induced noise in a physical circuit wiring design, the method comprising:
    identifying all drivers in said physical circuit wiring design;
    tracing interconnect lines in said circuit design, starting with the driver associated with said interconnect lines, to determine a routed length from said driver to each interconnect wire segment break point;
    constructing, by a processor execution of code on the computer system, a spatial vector for each interconnect wire segment in a physical circuit wiring design, wherein each said spatial vector is defined by a starting point corresponding to the break point of said interconnect wire segment closer to said driver and an ending point corresponding to the break point of said interconnect wire segment farther from said driver, and said spatial vector represents orientations of said interconnect wire segment;
    comparing spatial vectors of said physical circuit wiring design; identifying any of said spatial vectors that are parallel to each other and have opposite directions; and
    providing a warning message whenever a first spatial vector is parallel to and directed in an opposite direction to a second spatial vector, wherein said warning message provides an indication for a board designer to reroute one or more segments.

12. The method as claimed in claim 11, further comprising: storing said routed length.

13. The method as claimed in claim 11, wherein said constructing said spatial vector comprises:
    defining an origin in said circuit design.

14. The method as claimed in claim 13, further comprising:
    defining a Cartesian coordinate system with respect to said origin.

15. The method as claimed in claim 14, wherein said Cartesian coordinate system is orthogonal to said connector wire segments.

16. The method as claimed in claim 11, further comprising:
defining a geometry window in said physical circuit wiring design; and
wherein comparing said spatial vectors comprises comparing said spatial vectors in said geometry window.

17. The method as claimed in claim 16, wherein said geometry window comprises a transmit channel in said physical circuit wiring design.

18. The method as claimed in claim 16, wherein said geometry window comprises a receive channel in said physical circuit wiring design.

* * * * *